United States Patent
Liu et al.

(10) Patent No.: US 11,307,471 B2
(45) Date of Patent: Apr. 19, 2022

(54) ARRAY SUBSTRATE, MANUFACTURING METHOD THEREOF, AND DISPLAY

(71) Applicants: Beijing BOE Display Technology Co., Ltd., Beijing (CN); BOE Technology Group Co., Ltd., Beijing (CN)

(72) Inventors: Mingxuan Liu, Beijing (CN); Xiangmeng Zhang, Beijing (CN); Honggang Liang, Beijing (CN); Zumou Wu, Beijing (CN); Honghui Wang, Beijing (CN); Hongming Qu, Beijing (CN); Xiangqian Ding, Beijing (CN); Yongzhi Song, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/204,907

(22) Filed: Mar. 17, 2021

(65) Prior Publication Data
US 2021/0389636 A1      Dec. 16, 2021

(30) Foreign Application Priority Data
Jun. 16, 2020   (CN) .......................... 202010547597.7

(51) Int. Cl.
  *G02F 1/1362*   (2006.01)
  *G02F 1/1335*   (2006.01)
  *H01L 27/12*    (2006.01)

(52) U.S. Cl.
  CPC .. *G02F 1/136295* (2021.01); *G02F 1/133514* (2013.01); *H01L 27/1244* (2013.01); *H01L 27/1259* (2013.01)

(58) Field of Classification Search
  CPC ......... G02F 1/136295; G02F 1/133514; H01L 27/1244; H01L 27/1259
  USPC .................................................. 349/149–152
  See application file for complete search history.

(56) References Cited

U.S. PATENT DOCUMENTS

| | | | |
|---|---|---|---|
| 8,222,644 B2 * | 7/2012 | Yang | H05K 1/0265 257/59 |
| 2018/0247992 A1 * | 8/2018 | Cho | H01L 23/5283 |
| 2021/0200013 A1 * | 7/2021 | Li | H05K 1/11 |

* cited by examiner

*Primary Examiner* — Charles S Chang
(74) *Attorney, Agent, or Firm* — Arch & Lake LLP

(57) ABSTRACT

An array substrate, a display, and a manufacturing method are provided. The array substrate is provided with a first notch on at least one of two sides in a width direction of the second fan-out line, wherein a portion of the insulating layer fills into the first notch in a direction towards the second fan-out line to form a recess part corresponding to the first notch, the recess part defining a groove. A protruding part is provided on at least one of two sides in a width direction of the first fan-out line, where a part of the protruding part fills into the groove in a direction towards the insulation layer to form a protrusion corresponding to the groove.

20 Claims, 5 Drawing Sheets

A-A

ARRAY SUBSTRATE, MANUFACTURING METHOD THEREOF, AND DISPLAY

CROSS REFERENCE TO RELATED APPLICATION

The present application claims priority to Chinese Patent Application No. 202010547597.7, filed Jun. 16, 2020, which is incorporated herein by reference in its entirety for all purposes.

TECHNICAL FIELD

The present disclosure relates to the field of display, in particular, to an array substrate, a display, and a method for manufacturing an array substrate.

BACKGROUND

In related technology, the fan-out area of the array substrate generally uses single-layer wiring to arrange the fan-out lines. The fan-out area is usually located in a bezel area of the array substrate. So, in order to reduce the area occupied by the fan-out area to achieve a narrow-bezel display, some array substrates have begun to use double-layer wiring to arrange the fan-out lines. However, according to this type of wiring, in subsequent processing, such as in the process of cleaning, exposure, etching, etc., it is easy for the outermost fan-out line to fall off or break due to influences from rinsing and air knife, thus affecting the product yield of the array substrate.

SUMMARY

A first aspect of the present disclosure provides an array substrate.

A second aspect of the present disclosure provides a display comprising the above array substrate.

A third aspect of the present disclosure provides a method for manufacturing the array substrate described above.

According to an embodiment of the present disclosure, an array substrate comprises a substrate body. The substrate body comprises a display area and a fan-out area, wherein signal lines are provided in the display area, at least two fan-out layers spaced apart in the thickness direction of the substrate body are provided in the fan-out area, and an insulating layer is provided between two adjacent fan-out layers. A first fan-out line connected to the signal lines is provided in the fan-out layer away from the substrate body, and a second fan-out line connected to the signal lines is provided in the fan-out layer close to the substrate body. At least one of the two sides in a width direction of the second fan-out line is provided with a first notch, wherein a portion of the insulating layer fills into the first notch in a direction towards the second fan-out line to form a recess part corresponding to the first notch, the recess part defining a groove. At least one of the two sides in a width direction of the first fan-out line is provided with a protruding part, wherein a portion of the protruding part fills into the groove in a direction towards the insulation layer to form a protrusion corresponding to the groove.

In some embodiments of the present disclosure, the width of the first fan-out line remains constant in a length direction of the first fan-out line.

In some embodiments of the present disclosure, at least one of the two sides in the width direction of the first fan-out line is provided with a second notch, the second notch and the protruding part are opposite to each other in the width direction of the first fan-out line, and orthographic projections of the protruding part and the second notch in a plane parallel to the substrate body are the same in shape and area.

In some embodiments of the present disclosure, in a plane parallel to the substrate body, the orthographic projection of the first fan-out line overlaps at least partially with the orthographic projection of the second fan-out line.

In some embodiments of the present disclosure, the width of the second fan-out line remains constant in a length direction of the second fan-out line.

In some embodiments of the present disclosure, at least one of the two sides in the width direction of the second fan-out line is provided with an extension part, the first notch and the extension part are opposite to each other in the width direction of the second fan-out line, and orthographic projections of the extension part and the first notch in a plane parallel to the substrate body are the same in shape and area.

In some embodiments of the present disclosure, the first fan-out line is provided with a second notch on at least one of the two sides in the width direction of the first fan-out line, the second notch and the protruding part are opposite to each other in the width direction of the first fan-out line, orthographic projections of the protruding part and the second notch in a plane parallel to the substrate body are the same in shape and area, and in the thickness direction of the array substrate, the extension part faces the second notch.

In some embodiments of the present disclosure, the first notch, the recess part, the groove, and the protrusion are provided in plural and divided into multiple mating groups, wherein each mating group comprises a respective first notch, a respective recess part, a respective groove, and a respective protrusion, and in each mating group, the recess part fills into the first notch and the protrusion fills into the groove.

In some embodiments of the present disclosure, the first notch is a rectangular opening having a length a in a value range of 2-6 microns and/or a width b in a value range of 0.5-2 microns, and the shortest distance c between two adjacent first notches in the length direction of the second fan-out line is in a value range of 0.5a-2a.

In some embodiments of the present disclosure, the fan-out lines have a width of 2.5-4 microns.

According to an embodiment of the present disclosure, a display comprises: an array substrate as described above; a color filter substrate, provided oppositely to the array substrate; and a liquid crystal layer, provided between the array substrate and the color filter substrate.

According to an embodiment of the present disclosure, a method is provided for manufacturing an array substrate as described above, wherein the signal lines comprise a scan line and a data line. The manufacturing method comprises the steps of: forming the scan line and the second fan-out lines simultaneously on a base substrate; forming the insulating layer on a side of the second fan-out lines away from the base substrate; and forming the data line and the first fan-out lines on a side of the insulating layer away from the base substrate.

Additional aspects and advantages of the present disclosure will be given in part in the following description, in part as will become apparent from the following description, or as will be learned through the practice of the present disclosure.

BRIEF DESCRIPTION OF THE DRAWINGS

The foregoing and/or additional aspects and advantages of the present disclosure will become apparent and readily

DETAILED DESCRIPTION OF THE EMBODIMENTS

Embodiments of the present disclosure are described in detail below, and examples of embodiments are shown in the accompanying drawings, wherein the same or similar designations from beginning to end indicate the same or similar components or components having the same or similar functions. The embodiments described below by reference to the accompanying drawings are exemplary and are intended only to explain the present disclosure and are not to be construed as limiting the present disclosure.

The following describes an array substrate 100, a display, an electronic device, and a method for manufacturing the array substrate 100 according to embodiments of the present disclosure with reference to the accompanying drawings. The base substrate becomes the array substrate 100 (i.e., TFT substrate) after being processed by an arraying process and the array substrate 100 has numerous thin-film transistors (i.e., TFTs) distributed thereon, thus being an important part of the display.

Figure 1:
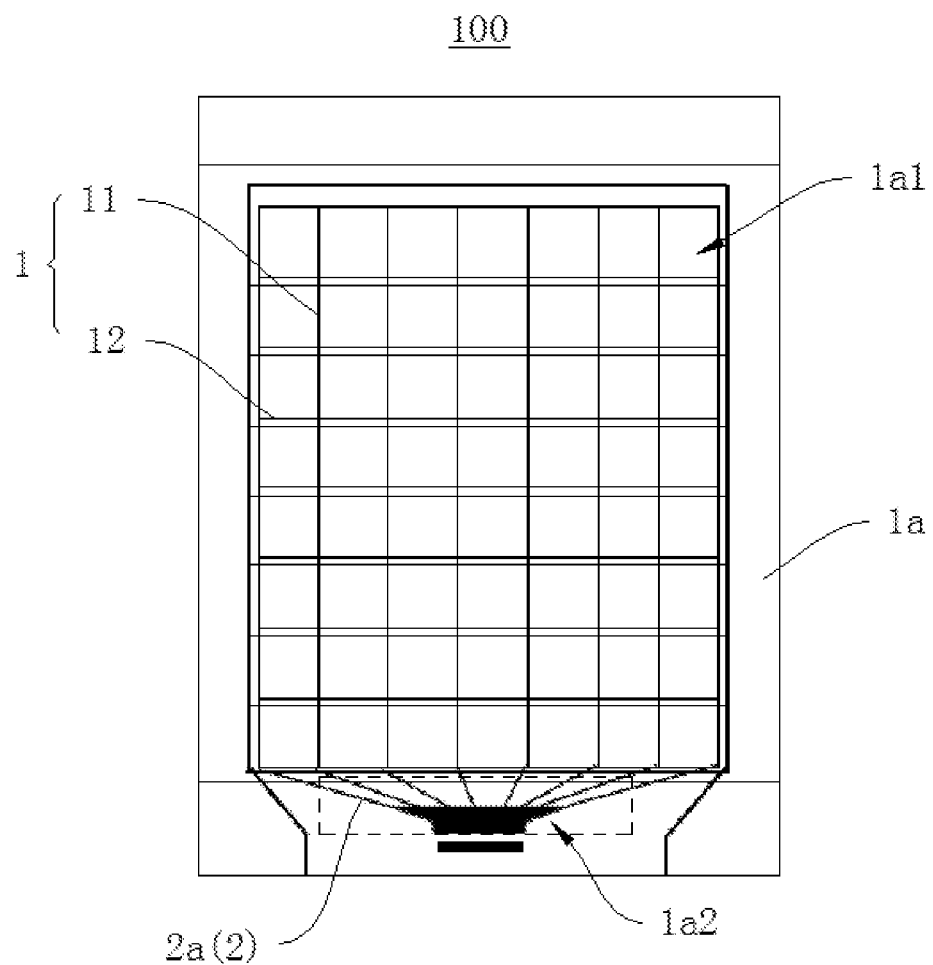
FIG. 1 is a schematic structural top view of an array substrate according to an embodiment of the present disclosure.

As shown in FIG. 1, according to an embodiment of the present disclosure, an array substrate 100 includes a substrate body 1a, wherein the substrate body 1a includes a display area 1a1 and a fan-out area 1a2.

As shown in FIG. 1, the display area 1a1 is provided with a signal line 1. Specifically, in practice, the signal line 1 usually includes a scan line 12 and a data line 11, and the scan line 12 and the data line 11 are both provided in plural, especially provided in a staggered manner. Each thin film transistor on the array substrate 100 is connected to a scan line 12 and a data line 11 respectively, wherein the scan line 12 is used to provide a scan signal and the data line 11 is used to provide a driving signal. The related structure and principle are well known to the technical person in the field, so they will not be repeated here.

Figure 8:
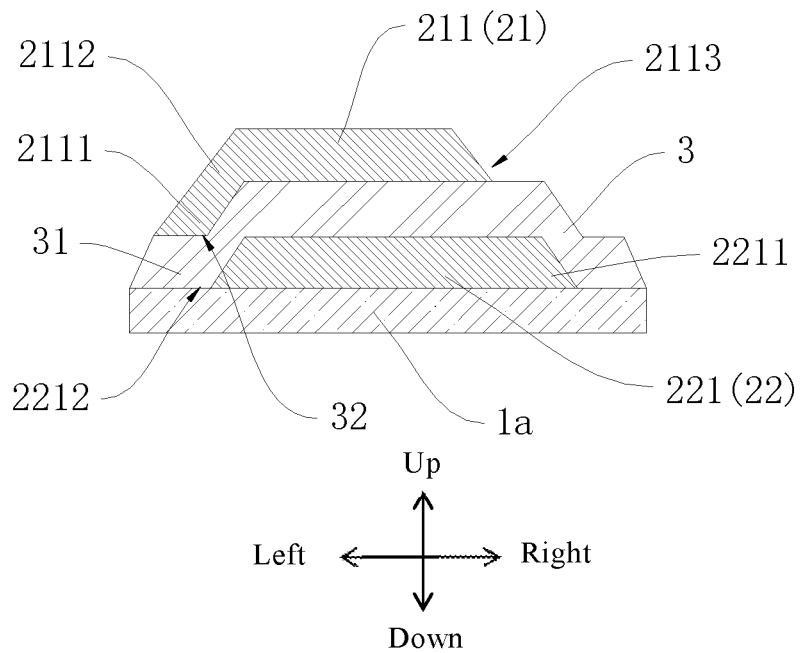
FIG. 8 is a schematic sectional diagram along the A-A direction in FIG. 7.

As shown in FIGS. 1 and 8, the fan-out area 1a2 includes two fan-out layers 2 spaced apart along the thickness direction (e.g., the top and bottom direction) of the substrate body 1a, wherein each fan-out layer 2 is provided with a fan-out line 2a connected to the signal line 1. In other words, the fan-out area 1a2 refers to an area where the fan-out lines 2a are distributed, and the fan-out area 1a2 is usually disposed in a bazel area of the substrate body 1a, wherein binding terminals are also provided in the bazel area. The fan-out line 2a is connected to the signal line 1 at one end and to the binding terminal at the other end. The binding terminal can be bound to a control chip (such as an IC), so that the control chip can pass the control signal to the signal line 1 through the fan-out line 2a, so as to adjust the display effect. In addition, the fan-out line 2a is wired in a double-layer way, so that the overall size of the fan-out area 1a2 can be effectively reduced as compared to the single-layer wiring in the related technology, thus facilitating the effect of a narrow-bezel display. In the description of the present disclosure, the meaning of "plurality" includes two or more. In the following, the embodiment where the array substrate includes two fan-out layers 2 will be illustrated as an example, but this does not constitute any limitation to the present disclosure.

The present disclosure does not limit whether the number of fan-out lines 2a in different fan-out layers 2 is equal and the specific number of fan-out lines 2a in each fan-out layer 2, etc., which can be selected according to actual wiring requirements. Optionally, when there are multiple fan-out lines 2a in a single fan-out layer 2, the multiple fan-out lines 2a are spaced apart.

As shown in FIG. 8, an insulating layer 3 is provided between two adjacent fan-out layers 2, and the insulating layer 3 thus provided prevents the fan-out lines 2a in the fan-out layers 2 located on both sides of the insulating layer 3 from coming into contact and short-circuiting.

As shown in FIG. 5, FIG. 6, FIG. 7 and FIG. 8, the fan-out layer 2 away from the substrate body 1a, i.e., the fan-out layer 2 farthest from the substrate body 1a, is the outermost fan-out layer 21 (e.g., the uppermost fan-out layer 2 in the figure), and the fan-out line 2a in the outermost fan-out layer 21 is called the first fan-out line 211. The fan-out layer 2 close to the substrate body 1a, i.e., the fan-out layer 2 closest to the substrate body 1a, is the innermost fan-out layer 22 (e.g., the lowermost fan-out layer 2 in the figure), and the fan-out line 2a in the innermost fan-out layer 22 is called the second fan-out line 221.

A first notch 2212 is provided on at least one side of the two sides in the width direction (e.g. the left and right direction) of the second fan-out line 221. That is to say, for the two sides in the width direction of the second fan-out line 221, the first notch 2212 may be provided on only one side (for example, the left side in FIG. 5), and the first notch 2212 may be provided on both two sides (for example the left and right sides in FIG. 2). A portion of the insulation layer 3 is recessed in a direction (e.g., downward) towards the second fan-out line 221 to form a recess part 31, and the recess part 31 defines a groove 32. At least one of the two sides in the width direction (e.g., left and right directions) of the first fan-out line 211 is provided with a protruding part 2112. That is, only one of the two sides (e.g., the left side in FIG. 6) in the width direction of the first fan-out line 211 may be provided with a protruding part 2112. However, the protruding part 2112 can be provided on both sides (e.g., the left side and the right side in FIG. 3). A portion of the protruding part 2112 protrudes in a direction towards the insulation layer 3 (e.g., downward) to form a protrusion 2111. The recess part 31 is inserted into the first notch 2212 to match with the first notch 2212, and the protrusion 2111 is inserted into the groove 32 to match with the groove 32. With this structure, the adhesion between the first fan-out line 211 and the insulation layer 3 can be improved, so that the first fan-out line 211 is less likely to fall off or break during the subsequent processing (e.g., exposure and etching). Thus, the product yield of the array substrate 100 can be improved.

In addition, for double-layer wiring, the innermost second fan-out 221 is usually formed first, then the middle insulating layer 3 is formed on the second fan-out 221, and finally the first fan-out 211 is formed on the insulating layer 3. Because the second fan-out line 221, the insulating layer 3 and the first fan-out line 211 are thin film structures formed by deposition, the structure of the second fan-out line 221 affects the structure of the insulating layer 3 deposited onto the second fan-out line 221, which in turn affects the structure of the first fan-out line 211 deposited onto the insulating layer 3. Therefore, referring to FIGS. 5, 6 and 8, when the second fan-out line 221 is provided with a first notch 2212, a portion of the insulating layer 3 deposited on the second fan-out line 221 is recessed downward to fill into the first notch 2212, thus forming a recess part 31. The recess part 31 is inserted into the first notch 2212, and the recess part 31 is recessed downward to define a groove 32 being open on top. Thus, the protruding part 2112 of the first fan-out line 211 deposited on the insulating layer 3 creates a protrusion 2111 protruding downward and fitting into the groove 32, i.e., the protrusion 2111 is inserted into the groove 32. In this way, in a plane parallel to the substrate body 1a, the orthographic projection of the recess part 31 coincides with the orthographic projection of the first notch 2212, while the orthographic projection of the protrusion 2111 coincides with the orthographic projection of the groove 32. The first notch 2212 is provided on at least one of the two sides in the width direction of the second fan-out line 221, and the protruding part 2112 is provided on at least one of the two sides in the width direction of the first fan-out line 211, which is convenient for processing and molding.

According to an embodiment of the present disclosure, in the array substrate 100, the first fan-out line 211 is provided with a protrusion 2111 and the insulating layer 3 is provided with a groove 32, wherein the protrusion 2111 fills into the groove 32. In this way, the adhesion between the first fan-out line 211 and the insulating layer 3 can be improved, thus making the first fan-out line 211 less likely to fall off or break during the subsequent processing (such as exposure and etching), and thus improving the product yield of the array substrate 100. In addition, the first notch 2212 is provided on at least one of the two sides in the width direction of the second fan-out line 221. In this way, when the insulating layer 3 and the first fan-out line 211 are deposited and processed, the above-mentioned protrusion 2111 and groove 32 can be easily formed, and the structure is simple and easy to be processed.

Figure 3:
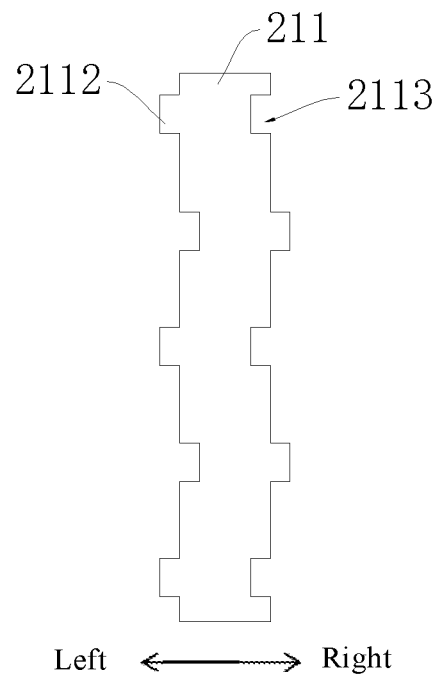
FIG. 3 is a schematic top view of a first fan-out line in a first structural form according to an embodiment of the present disclosure.
Figure 6:
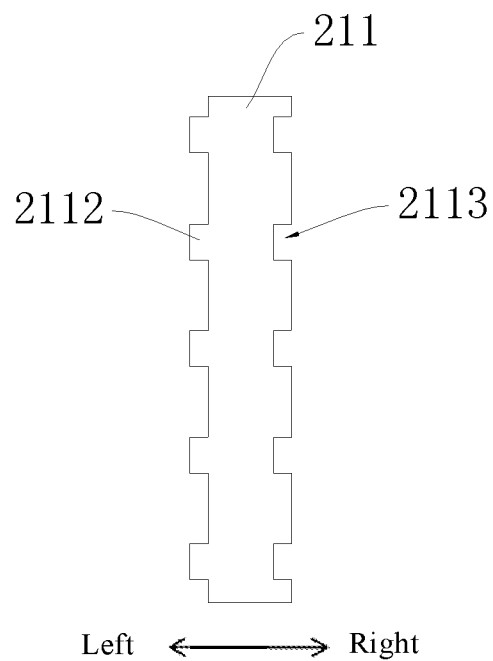
FIG. 6 is a schematic top view of a first fan-out line in a second structural form according to an embodiment of the present disclosure.

In some embodiments of the present disclosure, as shown in FIGS. 3 and 6, the width of the first fan-out line 211 is kept constant along the length direction of the first fan-out line 211, thereby avoiding a large difference in the resistance value in each part of the first fan-out line 211 due to the difference in width of each part of the first fan-out line 211, which affects the uniformity of the control signal transmitted to the corresponding signal line 1 through the first fan-out line 211 and results in an adverse effect on the final display.

Figure 4:
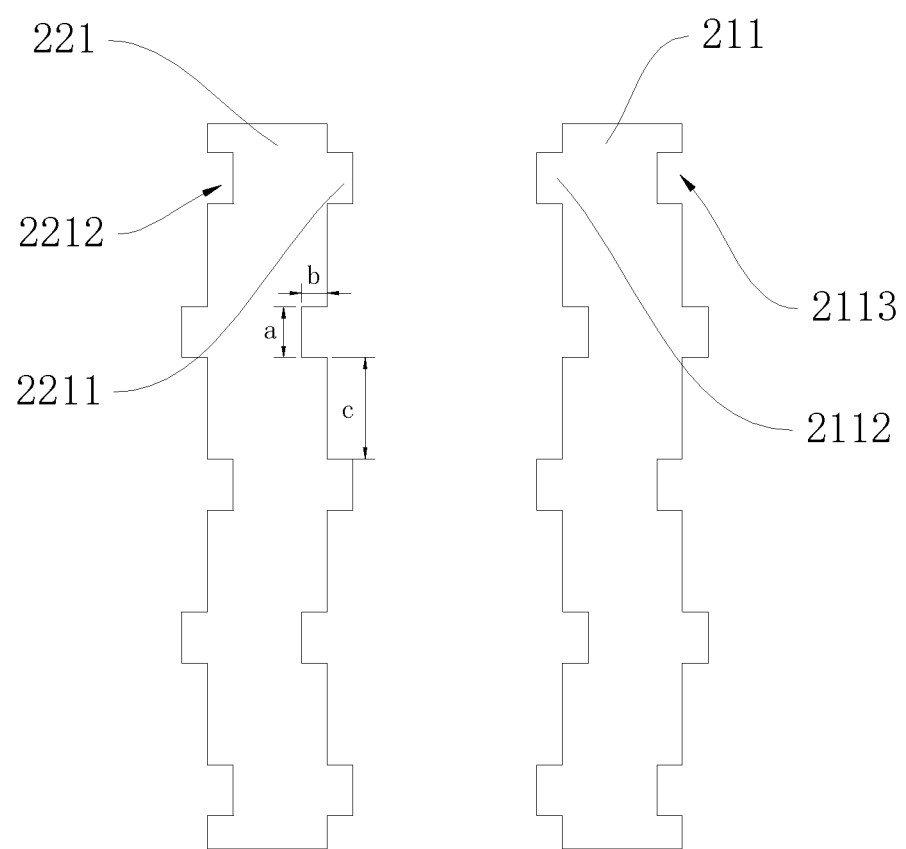
FIG. 4 is a schematic view where the second fan-out line in FIG. 2 is compared with the first fan-out line in FIG. 3.

In some embodiments of the present disclosure, as shown in FIGS. 3, 4 and 6, at least one of the two sides in the width direction (e.g., the left and right direction) of the first fan-out line 211 is provided with a protruding part 2112, which protruding part 2112 is located along the width direction of the first fan-out line 211 and protrudes in a direction away from the first fan-out line 211. At least one of the two sides in the width direction of the first fan-out line 211 is provided with a second notch 2113. I.e., for the two sides in the width direction of the first fan-out line 221, the protruding part 2112 may be provided only on one side (e.g., the left side in FIG. 6) while the other side (e.g., the right side in FIG. 6) is provided with the second notch 2113. Alternatively, the protruding part 2112 and the second notch 2113 can be provided both on one side (e.g., the left side in FIG. 3), and the other side (e.g., the right side in FIG. 3) is in a similar configuration, i.e., provided with not only the protruding part 2112 but also the second notch 2113. The second notch 2113 and the protruding part 2112 are opposite to each other in the width direction of the first fan-out line 211 (e.g., in the left and right direction). The orthographic projections of the protruding part 2112 and the second notch 2113 in a plane parallel to the substrate body 1a (e.g., in a horizontal plane) are the same in shape and area. In this way, the protruding portion of the protruding part 2112 and the missing portion of the second notch 2113 can be matched to each other. Thus, the first fan-out line 211 can be kept constant in width, rendering the structure to be simple and easy to implement.

Specifically, for example, referring to FIGS. 3 and 6, the protruding part 2112 and the second notch 2113 are both substantially rectangular in shape. Along the length direction of the first fan-out line 211, the protruding part 2112 has two spaced apart first edges, and the second notch 2113 has two spaced apart second edges, wherein in the width direction of the first fan-out line 211, the two first edges and the two second edges correspond to each other and are flush with each other.

Further, referring to FIG. 3, in some embodiments of the present disclosure, at least one of the two sides in the width direction of the first fan-out line 211 is provided with a protruding part 2112 and a second notch 2113, wherein the protruding part 2112 and the second notch 2113 are both provided in plural, and along the length direction of the first fan-out line 211, the multiple protruding parts 2112 and the multiple second notches 2113 are arranged alternately in sequence. The structure is simple, and the adhesion force between the first fan-out line 211 and the insulation layer 3 can be distributed more evenly.

Figure 7:
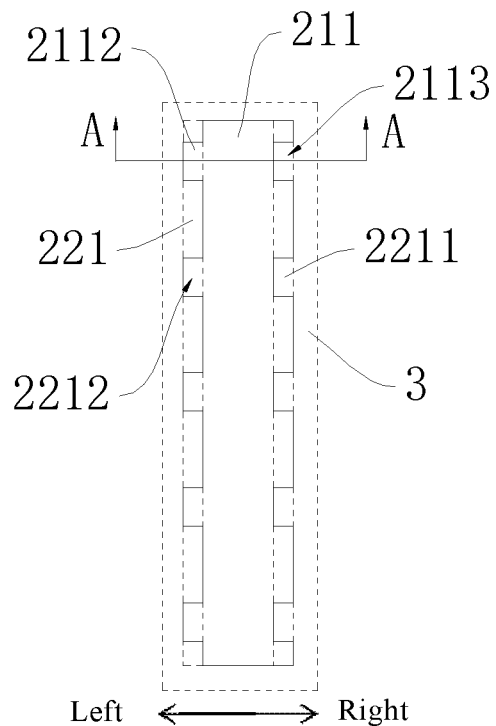
FIG. 7 is a schematic top view where a first fan-out and a second fan-out in the second structural form is partially overlapped according to an embodiment of the present disclosure.

In some embodiments of the present disclosure, as shown in FIGS. 7 and 8, in a plane parallel to the substrate body 1a, the orthographic projection of the first fan-out line 211 overlaps at least partially with the orthographic projection of the second fan-out line 221, i.e., the array substrate 100 uses double-layer wiring to arrange the fan-out lines 2a. Thereby, the processing and manufacturing of the fan-out line 2a is facilitated. The orthographic projection of the first fan-out line 211 overlaps at least partially with the orthographic projection of the second fan-out line 221, so that the area occupied by the fan-out area 1a2 can be further reduced on the basis of double-layer wiring.

It is understood that the larger the overlap between the orthographic projection of the first fan-out line 211 and the orthographic projection of the second fan-out line 221 in the plane parallel to the substrate body 1a, the better it is to reduce the occupied area of the fan-out area 1a2. The degree of overlap between the orthographic projection of the first fan-out line 211 and the orthographic projection of the second fan-out line 221 is related to the specific wiring of the first fan-out line 211 and the second fan-out line 221. The present disclosure does not limit in this regard, as long as there is a partial overlap between the orthographic projection of the first fan-out line 211 and the orthographic projection of the second fan-out line 221 in the plane parallel to the substrate body 1a.

In some embodiments of the present disclosure, as shown in FIG. 4, the widths of the first fan-out line 211 and the second fan-out line 221 are equal, which makes the structure simple and helps to reduce the difference in resistance between the first fan-out line 211 and the second fan-out line 221. Thus, it is prevented that the difference in resistance between the first fan-out line 211 and the second fan-out line 221 affects the uniformity of the control signal and thus affects the final display effect.

Optionally, in some embodiments of the present disclosure, in the plane parallel to the substrate body 1a, at least a partial overlap exists between the orthographic projection of the length centerline of the first fan-out line 211 and the orthographic projection of the length centerline of the second fan-out line 221. Thus, in the case where the widths of the first fan-out line 211 and the second fan-out line 221 are equal, in the plane parallel to the substrate body 1a, it is beneficial to achieve a state where the orthographic projection of the first fan-out line 211 and the orthographic projection of the second fan-out line 221 completely overlap in some wiring regions. In this way, the occupied area of the fan-out area 1a2 can be further reduced.

In some embodiments of the present disclosure, as shown in FIG. 8, the protrusion 2111 is facing the first notch 2212 in the thickness direction (e.g., the up and down direction) of the substrate body 1a, leading to a simple structure that facilitates processing and molding.

Specifically, for example, referring to FIGS. 5, 6, 7 and 8, when the second fan-out line 221 is provided with a first notch 2212, the protrusion 2111 on the first fan-out line 211 will be facing the first notch 2212 in the up-and-down direction, after the insulation layer 3 and the first fan-out line 211 are sequentially formed by the deposition process.

Figure 2:
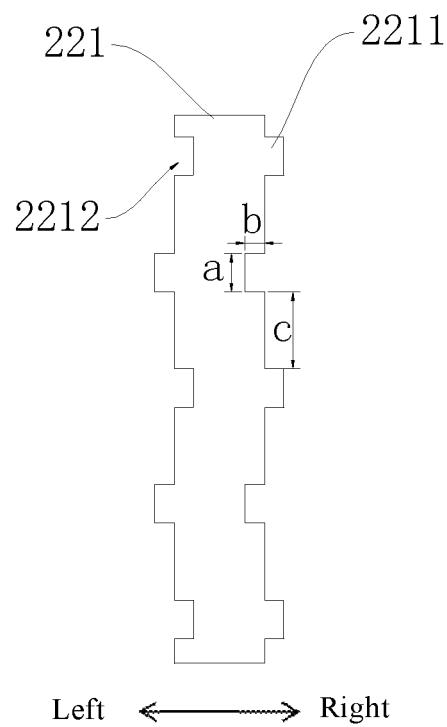
FIG. 2 is a schematic top view of a second fan-out line in a first structural form according to an embodiment of the present disclosure.
Figure 5:
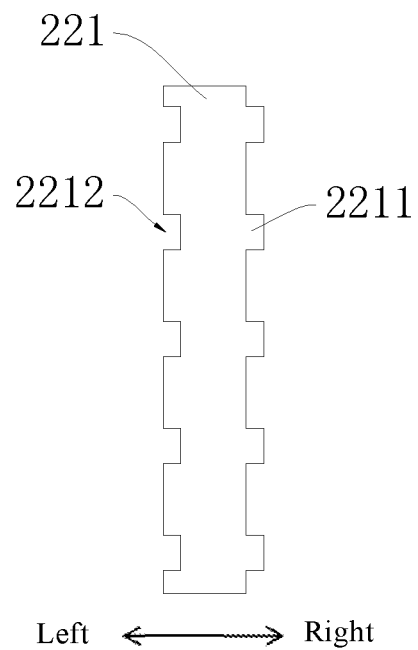
FIG. 5 is a schematic top view of a second fan-out line in a second structural form according to an embodiment of the present disclosure.

In some embodiments of the present disclosure, as shown in FIGS. 2, 4 and 5, the width of the second fan-out line 221 is kept constant along the length direction of the second fan-out line 221, thereby avoiding a large difference between the resistance values of various parts of the second fan-out line 221 due to the different widths of various parts of the second fan-out line 221, which affects the uniformity of the control signal transmitted to the corresponding signal line 1 through the second fan-out line 221 and results in an adverse effect on the final display.

In some embodiments of the present disclosure, as shown in FIGS. 2 and 5, at least one of the two sides in the width direction (e.g., the left and right direction) of the second fan-out line 221 is provided with a first notch 2212, and at least one of the two sides in the width direction of the second fan-out line 221 is provided with an extension part 2211 which is positioned along the width direction of the second fan-out line 221 and protruding in a direction away from the second fan-out line 221. For the two sides in the width direction of the second fan-out line 221, the extension part 2211 is only provided on one side (e.g., the right side in FIG. 5), and the first notch 2212 is only provided on the other side (e.g., the left side in FIG. 5). Alternatively, one of the two sides (e.g., the left side in FIG. 2) is provided with both the extension part 2211 and the first notch 2212, and the other side (e.g., the right side in FIG. 2) is the same, i.e., provided with both the extension part 2211 and the first notch 2212. In the width direction of the second fan-out line 221 (e.g., the left and right direction), the first notch 2212 and the extension part 2211 are opposite to each other. In a plane parallel to the substrate body 1a (e.g., in the horizontal plane), the orthographic projections of the extension part 2211 and the first notch 2212 are the same in shape and area, so that the width of the second fan-out line 221 remains the same, and the structure is simple and easy to implement.

Specifically, referring for example to FIGS. 2 and 5, the extension part 2211 and the first notch 2212 are both substantially rectangular in shape. In the length direction of the second fan-out line 221, the extension part 2211 has two spaced apart third edges and the first notch 2212 has two spaced apart fourth edges, wherein in the width direction of the second fan-out line 221, the two third edges and the two fourth edges correspond to each other and are flush with each other.

Further, referring to FIG. 2, in some embodiments of the present disclosure, at least one of the two sides in the width direction of the second fan-out line 221 is provided with both an extension part 2211 and a first notch 2212, and the extension part 2211 and the first notch 2212 are both provided in plural. The multiple extension parts 2211 and the multiple first notches 2212 are arranged alternately along the length direction of the second fan-out line 221. The structure is simple, and the adhesion force between the second fan-out line 221 and the insulation layer 3 can be distributed more evenly.

In some embodiments of the present disclosure, as shown in FIGS. 5, 6, 7, and 8, the extension part 2211 is facing the second notch 2113 in the thickness direction (e.g., the up and down direction) of the array substrate 100, leading to a simple structure that facilitates processing and molding.

Specifically, for example, referring to FIG. 7, in a plane parallel to the substrate body 1a, the orthographic projection of the extension part 2211 coincides with the orthographic projection of the second notch 2113.

In some embodiments of the present disclosure, as shown in FIGS. 5, 6, 7 and 8, the first notch 2212, the recess part 31, the groove 32 and the protrusion 2111 are provided in plural and divided into multiple mating groups, wherein each mating group comprises a first notch 2212, a recess part 31, a groove 32 and a protrusion 2111, and in each mating group, the recess part 31 fills into the first notch 2212 and the protrusion 2111 fills into the groove 32. Thus, the structure is simple, and the adhesion of the second fan-out wire 221 to the insulation layer 3 can be improved.

In some embodiments of the present disclosure, as shown in FIG. 2, the first notch 2212 is a rectangular opening having a length a in the value range of 2-6 microns and/or a width b in the value range of 0.5-2 microns, and the shortest distance c between two adjacent first notches 2212 in the length direction of the second fan-out line 221 is in the value range of 0.5a-2a. Whereby, the structure is simple and easy for processing, and the first notch 2212 can be easily processed.

Optionally, a is 2 microns, 2.2 microns, 2.4 microns, 2.6 microns, 2.8 microns, 3 microns, 3.2 microns, 3.4 microns, 3.6 microns, 3.8 microns, 4 microns, 4.2 microns, 4.4 microns, 4.6 microns, 4.8 microns, 5 microns, 5.2 microns, 5.4 microns, 5.6 microns, 5.8 microns, or 6 microns.

Optionally, b is 0.5 micron, 0.6 micron, 0.7 micron, 0.8 micron, 0.9 micron, 1 micron, 1.1 micron, 1.2 micron, 1.3 micron, 1.4 micron, 1.5 micron, 1.6 micron, 1.7 micron, 1.8 micron, 1.9 micron, or 2 micron.

Optionally, c is 0.5a, 0.6a, 0.7a, 0.8a, 0.9a, 1a, 1.1a, 1.2a, 1.3a, 1.4a, 1.5a, 1.6a, 1.7a, 1.8a, 1.9a or 2a.

In some embodiments of the present disclosure, the width of the fan-out line 2a is 2.5-4 microns. Specifically, the width of the fan-out line 2a needs to be within a reasonable range. If the width of the fan-out line 2a is small, the processing difficulty of the fan-out line 2a will increase. If the width of the fan-out line 2a is large, it will increase the size of the fan-out area 1a2, which goes against to the narrow-bezel display. The present inventor has found in the actual study that when the width of the fan-out line 2a is 2.5-4 microns, it is beneficial to the processing of the fan-out line 2a, and also provides the fan-out area 1a2 with a smaller size.

Optionally, the width of the fan-out line 2a is 2.5 microns, 2.6 microns, 2.7 microns, 2.8 microns, 2.9 microns, 3 microns, 3.1 microns, 3.2 microns, 3.3 microns, 3.4 microns, 3.5 microns, 3.6 microns, 3.7 microns, 3.8 microns, 3.9 microns, or 4 microns.

According to an embodiment of the present disclosure, the display includes an array substrate 100, a color filter substrate and a liquid crystal layer, wherein the array substrate 100 is the array substrate 100 described above, the color filter substrate (i.e., CF substrate) is provided oppositely to the array substrate 100, and the liquid crystal layer is provided between the array substrate 100 and the color filter substrate.

According to the display of the present disclosure, the first fan-out line 211 is provided with a protrusion 2111 and the insulating layer 3 is provided with a groove 32, wherein the protrusion 2111 fills into the groove 32, so that the adhesion between the first fan-out line 211 and the insulating layer 3 can be improved. In this way, the first fan-out line 211 is less likely to fall off or break during the subsequent processing (such as exposure and etching), and thus the product yield can be improved. In addition, the first notch 2212 is provided on at least one of the two sides in the width direction of the second fan-out line 221. In this way, when the insulating layer 3 and the first fan-out line 211 are deposited and processed, the above-mentioned protrusion 2111 and groove 32 can be easily formed, and the structure is simple and easy for processing.

According to an embodiment of the present disclosure, the electronic device comprises the display described above.

In the electronic device according to an embodiment of the present disclosure, the first fan-out line 211 is provided with a protrusion 2111 and the insulating layer 3 is provided with a groove 32, wherein the protrusion 2111 fills into the groove 32, so that the adhesion between the first fan-out line 211 and the insulating layer 3 can be improved. In this way, the first fan-out line 211 is less likely to fall off or break during the subsequent processing (such as exposure and etching), and thus the product yield can be improved. In addition, the first notch 2212 is provided on at least one of the two sides in the width direction of the second fan-out line 221. In this way, when the insulating layer 3 and the first fan-out line 211 are deposited and processed, the above-mentioned protrusion 2111 and groove 32 can be easily formed, and the structure is simple and easy for processing.

According to an embodiment of the present disclosure, the method for manufacturing the array substrate 100 is provided, wherein the array substrate 100 is the array substrate 100 described above, and the signal lines 1 include the scan line 12 and the data line 11. The manufacturing method includes the following steps: S1, forming the scan line 12 and the second fan-out line 221 simultaneously on the base substrate; S2, forming the insulating layer 3 on a side of the second fan-out line 221 away from the base substrate; and S3, forming the data line 11 and the first fan-out line 211 simultaneously on a side of the insulating layer 3 away from the base substrate. Thus, processing of the array substrate 100 is enabled, and the whole process is simple and convenient with high efficiency.

It should be noted that the base substrate here refers to a substrate that has not yet undergone the arraying process. Depending on the material used, the base substrate can be, for example, a glass substrate or a plastic substrate, etc.

Specifically, for the array substrate 100, a layer-by-layer processing approach is used here, where the fan-out area 1a2 comprises two fan-out layers 2, the scan line 12 and the second fan-out line 221 within the innermost fan-out layer 22 can be formed simultaneously, then the insulation layer 3 is formed on the innermost fan-out layer 22, and finally the data line 11 and the first fan-out line 211 within the outermost fan-out layer 21 are formed simultaneously on the insulation layer 3.

It is worth noting that, at present in the processing of signal lines 1 (whether it is a scan line 12 or a data line 11) and fan-out line 2a (whether it is the second fan-out line 221 or the first fan-out line 211) made by metal, a film is deposited first, and then photoresist coating, exposure, development, etching and peeling process can be performed on the film sequentially to form lines. The relevant specific process has been familiar to the technical personnel in the field, and repeatation will not be provided here.

In the description of the present disclosure, it is to be understood that the terms "top", "bottom", "left", "right", "inside", "outside", etc., indicate orientational or positional relationships based on the accompanying drawings, and are intended only to facilitate and simplify the description of the present disclosure, not to indicate or imply that the device or component referred to must have a particular orientation, be constructed and operate in a particular orientation, and therefore is not to be construed as a limitation to the present disclosure.

In the description of the present disclosure, "first feature", "second feature" may include one or more such features. In addition, the terms "first" and "second" are used for descriptive purposes only, and are not to be construed as indicating or implying relative importance or implicitly specifying the number of technical features as indicated. Thus, the features qualified with "first" and "second" may explicitly or implicitly include one or more such features.

In the present disclosure, unless otherwise expressly specified and limited, the terms "mounted", "connected", "connecting", "fixed" and other terms should be understood in a broad sense. For example, it can be a fixed connection, or a removable connection, or in one piece. It can be a direct connection, or indirect connection through an intermediate medium. It can be a connection within two components or an interaction relationship between two components. For those of ordinary skill in the art, the specific meaning of the above terms in the present disclosure can be understood on a case-by-case basis.

In the description of the present specification, reference to the terms "some embodiments," "optional embodiments," etc. means that the specific features, structures, materials, or characteristics described in connection with the embodiment or example are included in at least one embodiment or example of the present disclosure. In the present specification, the schematic expression of the above terms does not necessarily refer to the same embodiment or example. Further, the specific features, structures, materials, or characteristics described may be combined in any one or more embodiments or examples in a suitable manner.

Although embodiments of the present disclosure have been shown and described, it will be understood by those of ordinary skill in the art that a variety of variations, modifications, replacements and variants of these embodiments may be made without departing from the principle and purpose of the present disclosure, the scope of which is limited by the claims and their equivalents.

LIST OF REFERENCE NUMERALS array substrate 100
substrate body 1a
display area 1a1
fan-out area 1a2
signal line 1
data line 11
scan line 12
fan-out layer 2
fan-out line 2a
outermost fan-out layer 21
first fan out line 211
protrusion 2111
protruding part 2112
second notch 2113
innermost fan-out layer 22
second fan-out line 221
extending part 2211
first notch 2212
insulation layer 3
recess part 31
groove 32.

The invention claimed is:

1. An array substrate, comprising a substrate body, wherein
the substrate body comprises a display area and a fan-out area,
signal lines are provided in the display area, at least two fan-out layers spaced apart in a thickness direction of the substrate body are provided in the fan-out area, and an insulating layer is positioned between two adjacent fan-out layers,
a first fan-out line connected to the signal lines is provided in a fan-out layer away from the substrate body, and a second fan-out line connected to the signal lines is provided in a fan-out layer close to the substrate body,
a first notch is provided on at least one of two sides in a width direction of the second fan-out line, wherein a portion of the insulation layer fills into the first notch in a direction towards the second fan-out line to form a recess part corresponding to the first notch, the recess part defining a groove, and
a protruding part is provided on at least one of two sides in a width direction of the first fan-out line, wherein a portion of the protruding part fills into the groove in a direction towards the insulation layer to form a protrusion corresponding to the groove.

2. The array substrate according to claim 1, wherein a width of the first fan-out line remains constant in a length direction of the first fan-out line.

3. The array substrate according to claim 2, wherein a second notch is provided on at least one of the two sides in the width direction of the first fan-out line, the second notch and the protruding part are opposite to each other in the width direction of the first fan-out line, and orthographic projections of the protruding part and the second notch in a plane parallel to the substrate body are the same in shape and area.

4. The array substrate according to claim 1, wherein in a plane parallel to the substrate body, an orthographic projection of the first fan-out line overlaps at least partially with an orthographic projection of the second fan-out line.

5. The array substrate according to claim 1, wherein a width of the second fan-out line remains constant in a length direction of the second fan-out line.

6. The array substrate according to claim 5, wherein an extension part is provided on at least one of the two sides in the width direction of the second fan-out line, the first notch and the extension part are opposite to each other in the width direction of the second fan-out line, and orthographic projections of the extension part and the first notch in a plane parallel to the substrate body are the same in shape and area.

7. The array substrate according to claim 6, wherein a second notch is provided on at least one of the two sides in the width direction of the first fan-out line, the second notch and the protruding part are opposite to each other in the width direction of the first fan-out line, orthographic projections of the protruding part and the second notch in the plane parallel to the substrate body are the same in shape and area, and the extension part faces the second notch in the thickness direction of the array substrate.

8. The array substrate according to claim 1, wherein the first notch, the recess part, the groove, and the protrusion are provided in plural and divided into a plurality of mating groups, each mating group comprising a respective first notch, a respective recess part, a respective groove, and a respective protrusion, and in each mating group, the recess part filling into the first notch and the protrusion filling into the groove.

9. The array substrate according to claim 8, wherein the first notch is a rectangular opening having a length a in a value range of 2-6 microns and/or a width b in a value range of 0.5-2 microns, and a shortest distance c between two adjacent first notches in a length direction of the second fan-out line is in a value range of 0.5a-2a.

10. The array substrate according to claim 1, wherein the fan-out lines have a width of 2.5-4 microns.

11. A display, comprising:
an array substrate;
a color filter substrate disposed oppositely to the array substrate; and
a liquid crystal layer located between the array substrate and the color filter substrate,
wherein the array substrate comprises a substrate body, the substrate body comprising a display area and a fan-out area, wherein
signal lines are provided in the display area, at least two fan-out layers spaced apart in a thickness direction of the substrate body are provided in the fan-out area, and an insulating layer is positioned between two adjacent fan-out layers,
a first fan-out line connected to the signal lines is provided in a fan-out layer away from the substrate body, and a second fan-out line connected to the signal lines is provided in a fan-out layer close to the substrate body,
a first notch is provided on at least one of two sides in a width direction of the second fan-out line, wherein a portion of the insulation layer fills into the first notch in a direction towards the second fan-out line to form a recess part corresponding to the first notch, the recess part defining a groove, and
a protruding part is provided on at least one of two sides in a width direction of the first fan-out line, wherein a portion of the protruding part fills into the groove in a direction towards the insulation layer to form a protrusion corresponding to the groove.

12. The display according to claim 11, wherein a width of the first fan-out line remains constant along a length direction of the first fan-out line.

13. The display according to claim 12, wherein a second notch is provided on at least one of the two sides in the width direction of the first fan-out line, the second notch and the protruding part are opposite to each other in the width direction of the first fan-out line, and orthographic projections of the protruding part and the second notch in a plane parallel to the substrate body are the same in shape and area.

14. The display according to claim 11, wherein in a plane parallel to the substrate body, an orthographic projection of the first fan-out line overlaps at least partially with an orthographic projection of the second fan-out line.

15. The display according to claim 11, wherein a width of the second fan-out line remains constant in a length direction of the second fan-out line.

16. The display according to claim 15, wherein an extension part is provided on at least one of the two sides in the width direction of the second fan-out line, the first notch and the extension part are opposite to each other in the width direction of the second fan-out line, and orthographic projections of the extension part and the first notch in a plane parallel to the substrate body are the same in shape and area.

17. The display according to claim 16, wherein a second notch is provided on at least one of the two sides in the width direction of the first fan-out line, the second notch and the protruding part are opposite to each other in the width direction of the first fan-out line, orthographic projections of the protruding part and the second notch in the plane parallel to the substrate body are the same in shape and area, and the extension part faces the second notch in the thickness direction of the array substrate.

18. The display according to claim 11, wherein the first notch, the recess part, the groove, and the protrusion are provided in plural and divided into a plurality of mating groups, each mating group comprising a respective first notch, a respective recess part, a respective groove, and a respective protrusion, and in each mating group, the recess part filling into the first notch and the protrusion filling into the groove.

19. The display according to claim 18, wherein the first notch is a rectangular opening having a length a in a value range of 2-6 microns and/or a width b in a value range of 0.5-2 microns, and a shortest distance c between two adjacent first notches in a length direction of the second fan-out line is in a value range of 0.5a-2a.

20. A method for manufacturing an array substrate, wherein the array substrate comprises a substrate body, the substrate body comprising a display area and a fan-out area, wherein signal lines are provided in the display area, at least two fan-out layers spaced apart in a thickness direction of the substrate body are provided in the fan-out area, and an insulating layer is positioned between two adjacent fan-out layers, a first fan-out line connected to the signal lines is provided in a fan-out layer away from the substrate body, and a second fan-out line connected to the signal lines is provided in a fan-out layer close to the substrate body, a first notch is provided on at least one of two sides in a width direction of the second fan-out line, wherein a portion of the insulation layer fills into the first notch in a direction towards the second fan-out line to form a recess part corresponding to the first notch, the recess part defining a groove, and a protruding part is provided on at least one of two sides in a width direction of the first fan-out line, wherein a portion of the protruding part fills into the groove in a direction towards the insulation layer to form a protrusion corresponding to the groove, the signal lines comprise a scan line and a data line, and the method comprises steps of:

forming the scan line and the second fan-out line simultaneously on a base substrate;

forming the insulating layer on a side of the second fan-out line away from the base substrate; and forming the data line and the first fan-out line simultaneously on a side of the insulating layer away from the base substrate.

\* \* \* \* \*